United States Patent
Tanzawa

(10) Patent No.: US 6,600,692 B2
(45) Date of Patent: Jul. 29, 2003

(54) SEMICONDUCTOR DEVICE WITH A VOLTAGE REGULATOR

(75) Inventor: Toru Tanzawa, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/082,104

(22) Filed: Feb. 26, 2002

(65) Prior Publication Data

US 2002/0118568 A1 Aug. 29, 2002

(30) Foreign Application Priority Data

Feb. 27, 2001 (JP) ........................................ 2001-052588

(51) Int. Cl.[7] ................................................. G11C 7/00
(52) U.S. Cl. .............. 365/226; 365/189.09; 365/189.11
(58) Field of Search ........................... 365/226, 189.11, 365/189.09, 203, 227; 326/88, 83, 81

(56) References Cited

U.S. PATENT DOCUMENTS

| | | | |
|---|---|---|---|
| 4,906,914 A | 3/1990 | Ohsawa | 323/314 |
| 5,844,853 A | * 12/1998 | Kitsukawa et al. | 365/226 |
| 5,952,851 A | * 9/1999 | Yuen | 326/88 |
| 5,973,980 A | * 10/1999 | Tiede et al. | 365/226 |

FOREIGN PATENT DOCUMENTS

JP 10-11987 1/1998

OTHER PUBLICATIONS

John F. Dickson, "On–Chip High–Voltage Generation in MNOS Integrated Circuits Using An Improved Voltage Multiplier Technique", IEEEJournal of Solid–State Circuits, vol. SC–11, No. 3, Jun. 1976, pp. 374–378.

* cited by examiner

Primary Examiner—Thong Quoc Le
(74) Attorney, Agent, or Firm—Oblon, Spivak, McClelland, Maier & Neustadt, P.C.

(57) ABSTRACT

A semiconductor device with a voltage regulator is disclosed. The voltage regulator includes: a driver including pull-up and pull-down transistors serially connected between an output node of an internal voltage generation circuit and a reference potential terminal, for outputting a regulated voltage at its regulated voltage output node corresponding to the connection node of the pull-up and pull-down transistors; a voltage divider circuit for subdividing the regulated voltage output to the regulated voltage output node; a first operational amplifier for controlling current drivability of the pull-down transistor in accordance with a difference between a first reference voltage and a divided output of the voltage divider circuit; and a second operational amplifier for controlling current drivability of the pull-up transistor in accordance with a difference between a second reference voltage and the divided output of the voltage divider circuit in such a way as to vary in a reverse direction to the current drivability of the pull-down transistor.

18 Claims, 12 Drawing Sheets

|  | READ | WRITE | ERASE |
|---|---|---|---|
| WL | 5V | 9V | −7V |
| BL | 1V | 5V("0")<br>0V("1") | FLOATING |
| SL | 0V | 0V | 10V |

Vref1 > Vref2

SEMICONDUCTOR DEVICE WITH A VOLTAGE REGULATOR

CROSS-REFERENCE TO RELATED APPLICATION

This application is based on and claims the benefit of priority from the prior Japanese Patent Application No. 2001-052588, filed on Feb. 27, 2001, the entire contents of which are incorporated herein by reference.

BACKGROUND OF THE INVENTION

1. Field of the Invention

This invention relates generally to a semiconductor device having a voltage regulator for output of a regulated voltage that is variable in response to an output voltage of an internal voltage generation circuit.

2. Description of the Related Art

Prior known electrically rewritable non-volatile semiconductor memory devices include electrically erasable programmable read-only memory (EEPROM) chips, also known as "Flash" memories in the semiconductor device art. Currently available Flash EEPROM chips come with an array of rows and columns of nonvolatile memory cells, each of which is typically formed of a metal insulator semiconductor field effect transistor (MISFET) of the so-called "stack gate" structure with a floating gate and a control gate being stacked above a semiconductor chip substrate. Each stack-gate MISFET memory cell stores therein a digital binary data bit of a logic "0" or "1" in accordance with the charge accumulation state of its floating gate. One example is that a storage data bit is assumed to be a logic "0" in the event that the floating gate storing thereon electrons is high in threshold voltage while letting the bit be a logic "1" when the floating gate releases the electrons and thus is low in threshold voltage.

Flash memories include EEPROMs of the NOR type. In the case of such NOR-EEPROMs, a memory cell array is arranged so that a respective one of rows of memory cells is associated with a corresponding one of parallel bit lines in a manner such that drains of these cells are connected together or "common-coupled" to the bit line whereas each column of memory cells is common-coupled at control gates to a corresponding one of parallel word lines that cross over the bitlines. A data write operation is performed after having erased all the cells of the memory array at a time, known as "all-at-a-time" or "all-at-once" erase among those skilled in the art. The all-at-once erase is achievable in a way as follows. Firstly all the wordlines of the memory cell array are applied a voltage of the negative polarity having a specific potential level—typically, −7 volts (V), or more or less. Then, apply a positive voltage of about +10V to a common source, causing electrons presently residing on floating gates to release toward the substrate side by Fowler-Nordheim (F-N) tunneling effects. Whereby, all the memory cells are thus set in the erase state of data "1."

Data writing on a per-cell basis is done by applying a write voltage of about 10V to a word line being presently selected from among the wordlines and then giving to the selected bitline either one of an on-chip power supply voltage Vdd and a source or "ground" voltage Vss in a way depending on whether the data being written is a logic "0" or "1." This voltage application results in that in a cell to which logic "0" data is given, "hot" electrons are injected into the floating gate thereof causing its threshold voltage to shift or "offset" in a positive direction. In the case of logic "1" data, no appreciable threshold voltage changes occur.

Data read is done by giving a read voltage to a selected wordline and then detecting the presence or absence of a cell current flow.

In the above operations, the data write is typically combined with a verify-read operation for confirmation or verification of the resulting write state. More specifically, after having written data under application of the write voltage, the verify-read operation is done. Repeated execution of such write voltage application and its following verify-read session forces the threshold voltage of a written memory cell to finally fall within a prespecified distribution range. Similarly in the case of data erase, recurrent execution of erase voltage application and its following erase-verify operation enables the threshold voltage of an erased cell to finally fall within a specified distribution range.

For adequate control of the above-noted operations in the write and erase modes, a need is felt to supply a stabilized and regulated voltage with its potential optimized on a per-mode basis. A presently available approach to generating such a regulated voltage is to employ a voltage regulator with an ability to generate a plurality of types of regulated voltages based on an output voltage of potential rise-up or "booster" circuitry for use as an internal power supply. A scheme using this approach is disclosed, for example, in J. F. Dickson, "On-Chip High-Voltage Generation in NMOS Integrated Circuits Using an Improved Voltage Multiplier Technique," IEEE Journal of Solid-State Circuits, Vol. SC-11, No. 3, June 1976 at pp. 374–378. Another technique is taught from A. Umezawa et al., "A 5V-Only Operation 0.6 μm Flash EEPROM with Row Decoder Scheme in Triple-Well Structure," IEEE J. Solid-State Circuits, Vol. 27, No. 11, November 1992, pp. 1540–1546.

See FIG. 18. This diagram shows an arrangement of one prior art voltage regulator adaptable for use with Flash EEPROM chips. This regulator shown herein includes a driver unit 1. The driver 1 has a serial connection of MOS transistors: a PMOS transistor QP2 for potential pull-up drive, and an NMOS transistor QN2 for pull-down drive. The pull-up PMOS transistor QP2 has a source, to which a potentially increased or "boosted" voltage Vpp as output from a potential booster circuit (not shown) is supplied. The pull-down NMOS transistor QN2 has its source which is coupled to ground. These transistors QP2, QN2 are coupled together at a connection node N0, which is for use as an output terminal of a regulated voltage Vreg.

An operational amplifier OP1 is provided for controlling a gate of the pull-down NMOS transistor QN2. It is an ensemble of operational amplifier OP2 and NMOS transistor QN1 plus PMOS transistor QP1 that controls a gate of the pull-up PMOS transistor QP2. The NMOS transistor QN1 is operable under control of an output of the op-amp OP2. The PMOS transistor QP1 functions as a current source load of NMOS transistor QN1. PMOS transistors QP1, QP2 make up a current mirror circuit.

The regulator of FIG. 18 has its output node N0, at which a voltage division circuit 2 is provided. This voltage divider circuit 2 includes a serial combination of resistors R1 to R3 and a switch element formed of an NMOS transistor QN3. Connected to a connection node N2 of the resistors R2–R3 is an NMOS transistor QN4 which operates under control of a write-use control signal PROG for coupling the node N2 to ground. NMOS transistor QN3 has its gate which is to be controlled by a verify-read control signal VRFY. When NMOS transistor QN3 is driven to turn on, a connection node N3 of resistor R3 and NMOS transistor QN3 is grounded.

One of the op-amps OP1–OP2—here, opamp OP2—is given a reference voltage Vref at its non-inverting input terminal, with a voltage potential at node N1 being fed back to an inverting input terminal thereof. The other opamp OP1 is such that the reference voltage Vref is given to its inverting input terminal while a potential at node N1 is fed back to its non-inverting input terminal.

This regulator experiences application of feedback control in a way such that the node N1 of voltage divider 2 becomes equal in potential to the reference voltage Vref being supplied to the opamps OP1–2 whereby it outputs a potentially regulated voltage Vreg with potential "trackability" to a change in boosted output voltage Vpp. More specifically, while the potentially divided output voltage that is obtainable at the node N1 of voltage divider 2 stays lower than the reference voltage Vref, the opamp OP1 derives its output voltage of high level causing NMOS transistor QN1 to turn on whereas an output of opamp OP1 is at low level letting NMOS transistor QN2 turn off. This results in the current mirror circuit of PMOS transistors QP1–2 permitting a pull-up current Iup to flow in pull-up PMOS transistor QP2, thereby forcing the regulated voltage Vreg obtained at output node N0 to increase in potential.

When the regulated voltage Vreg potentially rises up causing the voltage at voltage divider node N1 to become higher than the reference voltage Vref, the opamp OP2's output drops down at low level, letting NMOS transistor QN1 turn off. Simultaneously the opamp OP1's output becomes high level, causing NMOS transistor QN2 to turn on. This precludes flow of the pull-up current Iup while alternatively allowing a pull-down current Idn to flow in pull-down NMOS transistor QN2. This results in a likewise decrease in the regulated voltage Vreg. With the above-stated feedback control operation, there is obtainable the regulated voltage Vref that is stabilized at a preselected potential level lower than the boosted output voltage Vpp.

The stabilization level of the regulated voltage Vreg is variable at different levels depending upon whether each of the write control signal PROG and verify-read control signal VRFY is presently set at either "High" ("H") level or "Low" (L) level. This can be said because the voltage divider 2 must differ in potential division ratio in light of the fact that when the write control signal PROG stays at "H" and verify-read control signal VRFY is at "L," node N2 is grounded and, alternatively, when the former is at "L" and the latter is at "H," node N3 is grounded.

Practically, a write operation of an EEPROM chip using the FIG. 18 circuitry is as follows. When the write control signal PROG potentially goes high to reach "H" level, the boosted output voltage Vpp begins to rise up in potential. This potential increase permits a pull-up current Iup to flow in pull-up PMOS transistor QP2. Thus the regulated voltage Vreg at regulated voltage output node N0 behaves to potentially increase with an increase in the boosted voltage Vpp—say, the former "tracks" the latter. The required write voltage is thus obtained, which is well stabilized at a level of Vreg=7V, for example. After elapse of a "fixed" length of time, the write control signal PROG goes low to "L" level and the verify control signal VRFY goes high at "H" level. This forces node N3 to be grounded. Whereby, the regulated voltage Vreg is such that a lower level becomes a point of stabilization. Thus a verify-read voltage of for example about Vreg=5V is obtained.

With the voltage regulator shown in FIG. 18, in cases where the opamps OP1–2 have "ideal" characteristics with no appreciable input offsets, the resulting pull-up and pull-down currents Iup, Idn—these are derived from the driver 1's PMOS transistor QP2 and NMOS transistor QN2 respectively—vary with a change in potentially divided output voltage VN1 of the divider circuit node N1 in a pattern as demonstrated in FIG. 19A. The current-versus-voltage characteristic of FIG. 19A indicates the state that a penetration current Ion occurring due to simultaneous turn-on of these transistors QP2, QN2 stays less. In contrast, when opamps OP1–2 are relatively large in input offset, a large penetration current Ion can flow therein as shown in a characteristic diagram of FIG. 19B.

This penetration current would result in an increase in power consumption or dissipation of integrated circuits concerned. Another problem faced with the prior art is that the flow of larger penetration current in booster circuitry badly behaves to limit the performance of the booster, i.e. voltage boost ability or "boostability," in view of the fact that most booster circuits for generation of the boosted voltage Vpp are less in current supplying abilities. The limitation to boostability in turn leads to an increase in time as taken to create the boosted voltage Vpp and regulated voltage Vreg with potential trackability thereto. In the worst case, any desired regulated voltages will no longer be obtainable in any way.

SUMMARY OF THE INVENTION

A semiconductor device in accordance with one aspect of this invention has a voltage regulator for outputting a regulated voltage potentially varying in response to an output voltage of an internal voltage generation circuit. The voltage regulator includes: a driver including a pull-up transistor and a pull-down transistor serially connected between an output node of the internal voltage generation circuit and a reference potential terminal, for outputting a regulated voltage at its regulated voltage output node corresponding to the connection node of the pull-up and pull-down transistors; a voltage divider circuit configured to potentially subdivide the regulated voltage output at the regulated voltage output node; a first operational amplifier configured to control current drivability of the pull-down transistor in accordance with a difference between a first reference voltage and a divided output voltage of said voltage divider circuit; and a second operational amplifier configured to control current drivability of the pull-up transistor in accordance with a difference between a second reference voltage and the divided output voltage of the voltage divider circuit in such a way as to vary in a reverse direction to the current drivability of the pull-down transistor.

DETAILED DESCRIPTION OF THE EMBODIMENTS

Figure 1:
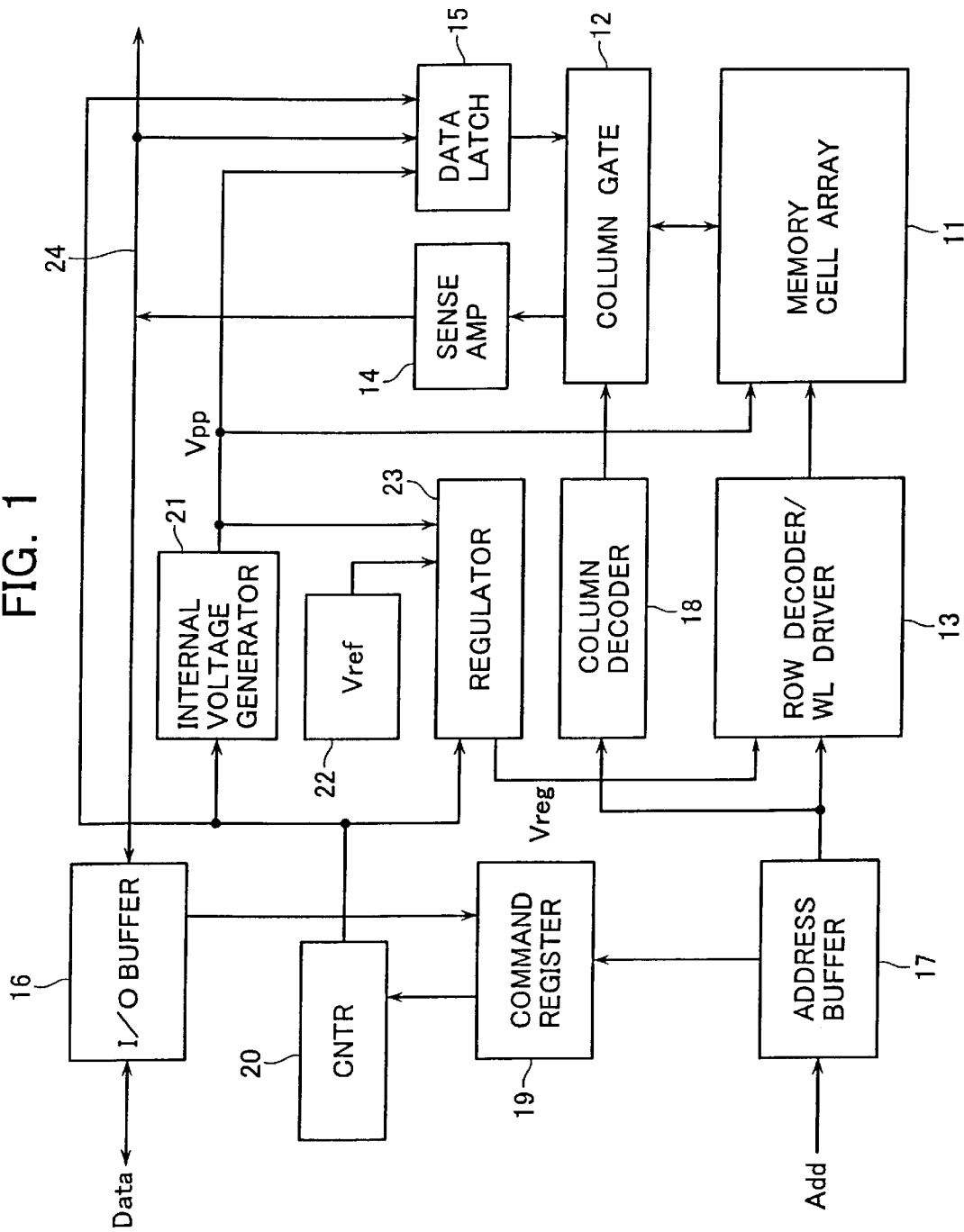
FIG. 1 is a diagram showing a configuration of an EEPROM device in accordance with an embodiment of this invention.
Figure 2:
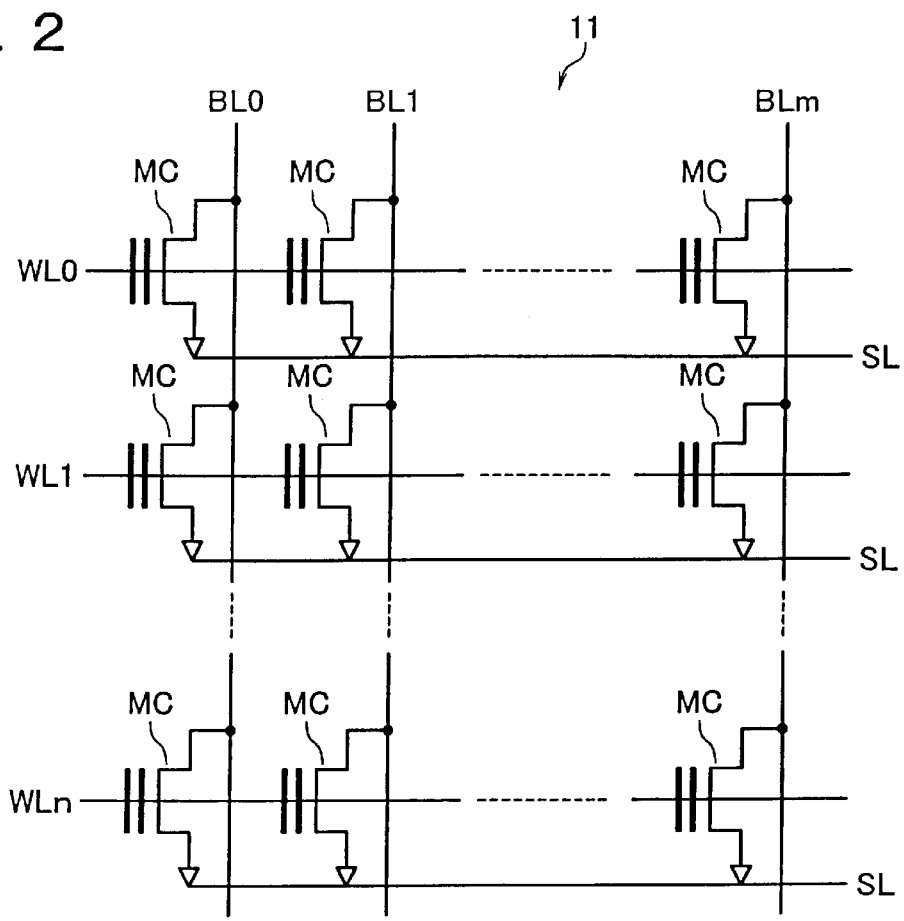
FIG. 2 is a diagram showing a configuration of a memory cell array of the EEPROM.
Figure 3:
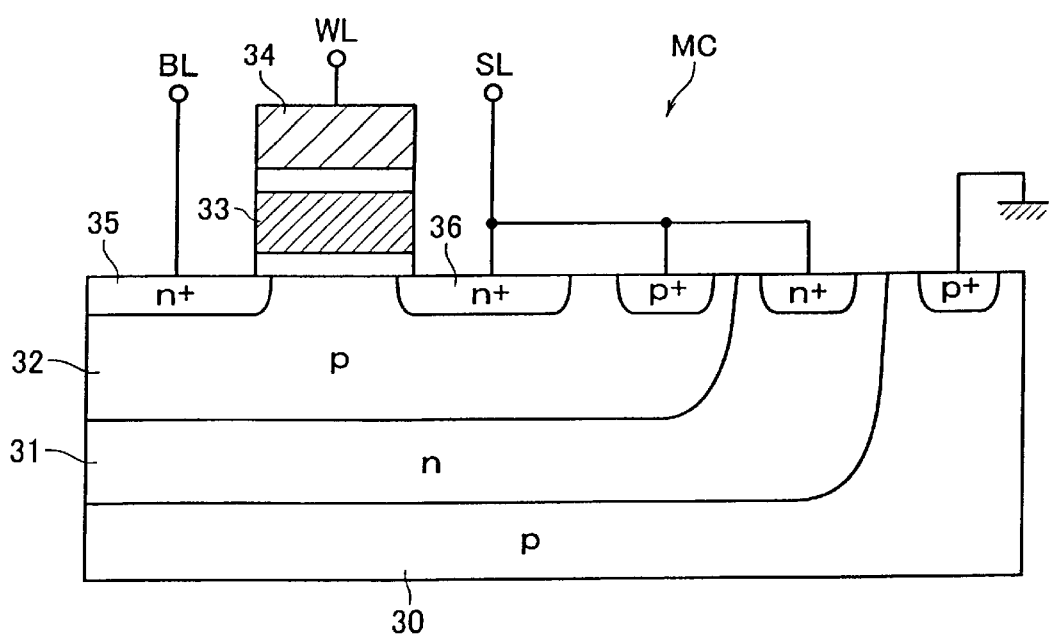
FIG. 3 is a diagram showing a structure of a memory cell of the EEPROM.

Referring now to FIG. 1, there is shown an overall configuration of a "Flash" EEPROM chip of the NOR type, which incorporates the principles of this invention. This Flash NOR-EEPROM includes an array 11 of rows and columns of memory cells. As shown in FIG. 2, this memory cell array 11 is constituted from a plurality of nonvolatile memory cells MC as organized into a matrix form. As shown in FIG. 3, each memory cell MC is formed of a metal oxide semiconductor field effect transistor (MOSFET) of the stacked gate structure type, with a floating gate 33 and a control gate 34 being stacked above a silicon substrate 30. Drains 35 of a column of memory cells MC are connected in common to a corresponding one of parallel bit lines BL whereas control gates 34 of a row of memory cells MC are commonly coupled to one of parallel word lines WL crossing over the bitlines BL. Their sources 36 are coupled to a common source line SL.

As shown in FIG. 1, the bitlines BL of the memory cell array 11 are connected through a column gate circuit 12 to a sense amplifier circuit 14 for sensing data being read and a data latch circuit 15 for holding to-be-written data therein. The sense amp circuit 14 and data latch circuit 15 are connected via a data line 24 to an input/output (I/O) buffer 16.

A row-decoder/word-line driver 13 is provided for performing selection and driving of the wordlines of memory cell array 11. Any external address will be once held in an address buffer 17 and then supplied to a column decoder 18 and the row-decoder/wordline driver 13.

An internal voltage generation circuit 21 is the one that is operable to generate a variety of kinds of control voltages required, including but not limited to a write voltage to be supplied to a presently selected control gate line of the memory cell array 11 during writing and an erase voltage being supplied during data erasing to a well region in which the memory cell array 11 is formed. Practically the internal voltage generator circuit 21 is a voltage rise-up circuit for potentially increasing or "boosting" the power supply voltage used to thereby produce a potentially boosted voltage Vpp for use during data writing, which will then be passed to a voltage regulator 23. Also input to this voltage regulator 23 is a reference voltage as supplied from a reference voltage generation circuit 22. The voltage regulator 23 is operatively responsive to receipt of a control signal incoming from a controller 20 for generating and issuing a regulated voltage, which is variable in potential with a change in the boosted voltage Vpp in such a way as to keep track of the voltage Vpp while having a different level in accordance with an operation mode. This regulated voltage is supplied to the row-decoder/wordline driver 13.

The controller 20 is responsive to receipt of a command as taken or "accommodated" into a command register 19 for generating and issuing control signals as used to control several operations, typically including a data write operation and its following verify-read operation along with a data erase operation and its following verify-read operation.

Figures 4, 5:
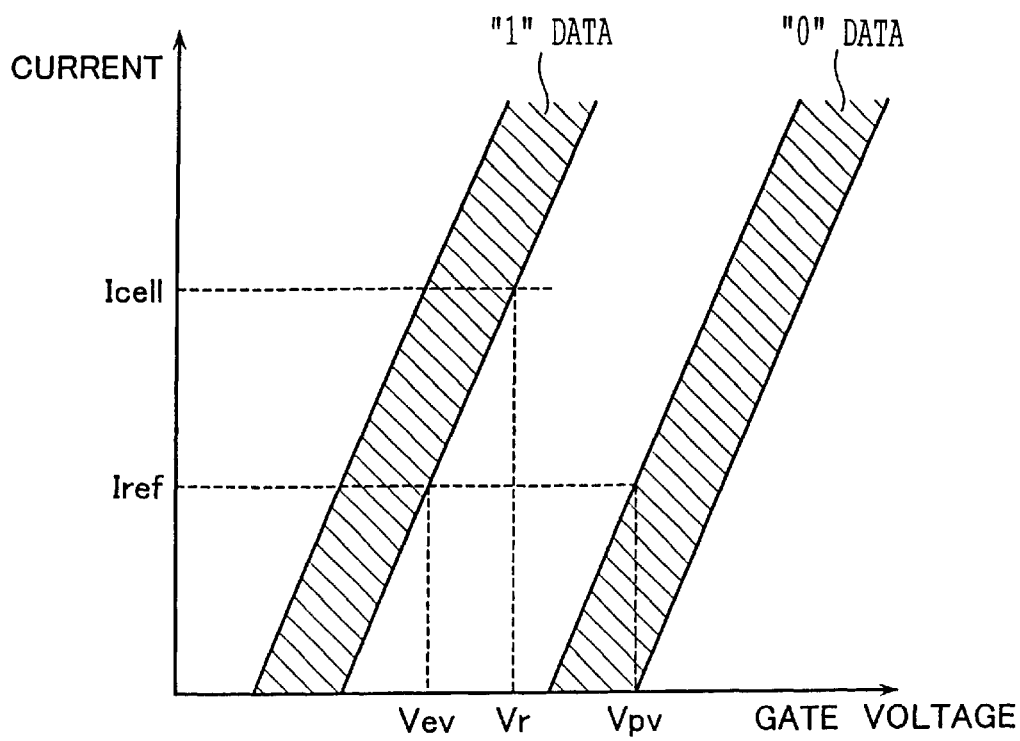
FIG. 4 is a diagram showing a voltage relationship in each operation mode of the EEPROM.
FIG. 5 is a graph showing a data distribution status of the EEPROM.

FIG. 4 shows a voltage relation in each operation mode of the EEPROM chip. Data erasing is such that all cells of the memory cell array 11 are erased at a time—say, all-at-once erasure. During such data erasing, all wordlines WL of the memory cell array 11 are applied a specified voltage of −7 volts (V). Simultaneously a voltage of +10V is applied to source lines SL, causing each bitline BL to be set in an electrically floating state. With this voltage application scheme, each memory cell is such that electrons residing at its floating gate are released toward the substrate by Fowler-Nordheim (F-N) tunnel effects, resulting in the cell being set in an erase state low in threshold voltage. FIG. 5 shows current versus voltage characteristics for demonstration of a typical threshold voltage distribution pattern of a memory cell storing therein data of a logic "0" and that of a memory cell of logic "1" data, wherein the data "1" low in threshold voltage is the erase state.

Data write is achievable by applying a write voltage of +9V to a presently selected wordline WL while at the same time applying a specific voltage to its associative bitline BL. This voltage is set at either Vdd=5V or Vss=0V in a way pursuant to the logic level of a data bit stored—i.e. logic "0" or "1." This results in creation of "hot" electrons at a memory cell that is given logic data "0." The hot electrons thus created are then injected into this cell's floating gate, causing it be set in the logic "0" data state that is high in threshold voltage as shown in FIG. 5.

Data read is to be done by giving a 5-V voltage for use as a read voltage Vr shown in FIG. 5 to a selected wordline to thereby detect whether the memory cell of interest is presently turned on or off. In FIG. 5, Vpv is a threshold voltage used for determination or "judgment" of write-verify read, and Vev is a threshold voltage used for judgment of erase-verify read. During data write, control is made for driving into a prespecified threshold voltage distribution through repeated alternate execution of pulsate write voltage application and verify-read operation. Similarly, during erasing, control is done for driving into a prespecified threshold voltage distribution through repeated alternate execution of read pulse voltage application and verify-read operation.

Figure 6:
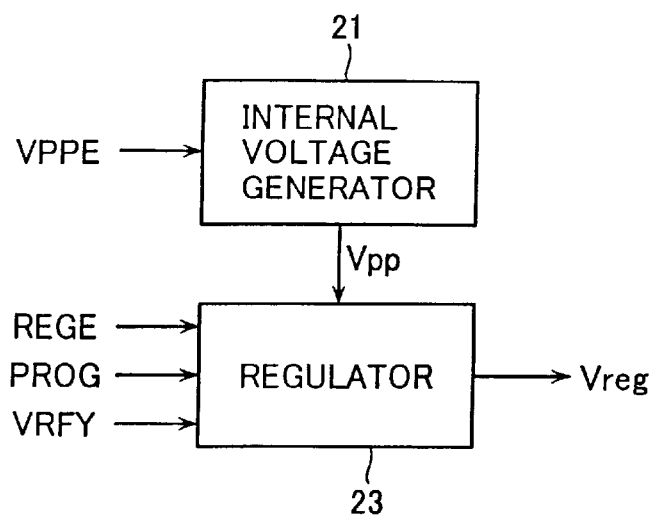
FIG. 6 is a diagram showing a control signal relation at part of an internal voltage generation circuit and a regulator of FIG. 1.

In the data write event, it is the voltage regulator 23 that generates a write voltage and a verify-read voltage to be used thereafter, based on a potentially boosted output voltage Vpp of the internal voltage generator circuit 21. Accordingly, as shown in FIG. 6, a combination of the internal voltage generator circuit 21 and voltage regulator 23 receives a variety of control signals—including boost enable signal VPPE, regulator enable signal REGE, write control signal PROG, and verify control signal VRFY—which are generated and supplied from the controller 20 to thereby produce a regulated voltage Vreg as shown in FIG. 7.

Figure 7:
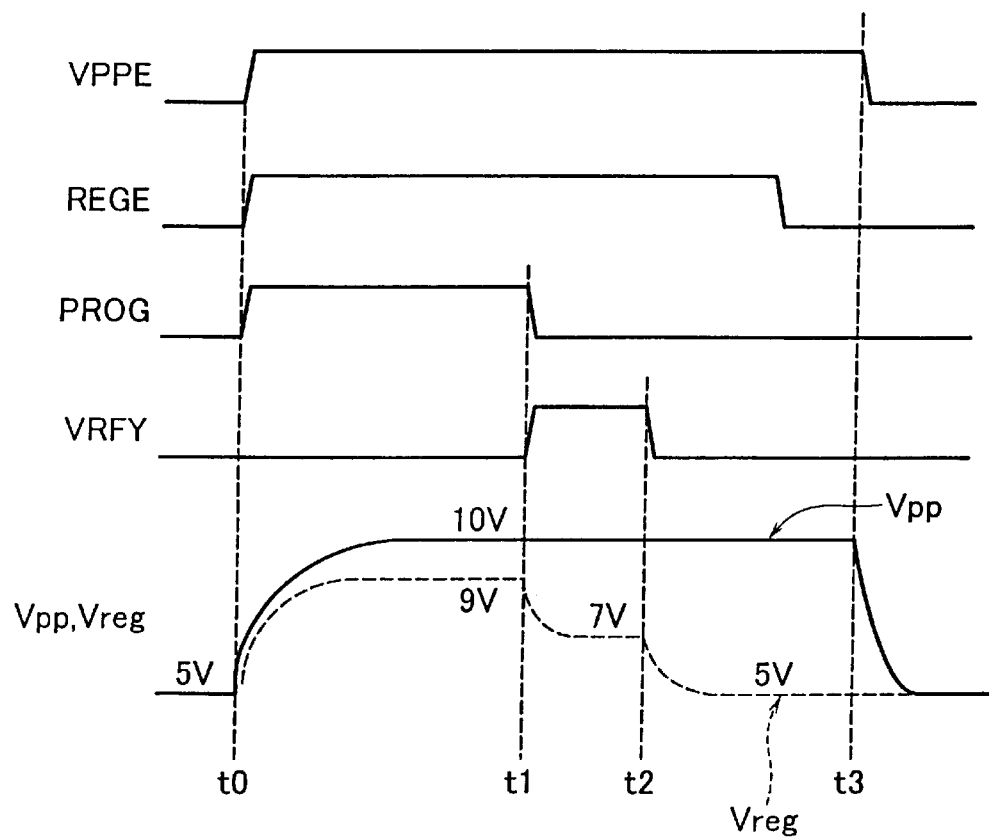
FIG. 7 is a diagram showing waveforms of several major voltage signals in a write cycle of the same.

As better seen in FIG. 7, when the boost enable signal VPPE and regulator enable signal REGE plus write control signal PROG potentially go high at a time point t0, the internal voltage generator 21 generates a boosted output voltage Vpp that rises up in potential from a level of Vdd=5V along with a control voltage Vreg which is potentially variable with a change in voltage Vpp—that is, the former potentially "tracks" the latter. This regulated voltage Vreg is for use as the write voltage to be given to a selected wordline. The boosted output voltage Vpp stays at approximately 10V. The regulated voltage Vreg is at about 9V during writing.

Thereafter when the write control signal PROG potentially drops down to "Low" or "L" level while the verify control signal VRFY goes high to "High (H)" level at a time point t1, the regulated voltage Vreg being output from the regulator 23 behaves to decrease in potential. This becomes the verify read-use voltage of about 7V to be given to the selected wordline. Further, when the verify control signal VRFY reaches "L" level at a time point t2, the output voltage of regulator 23 returns to 5V.

Figure 8:
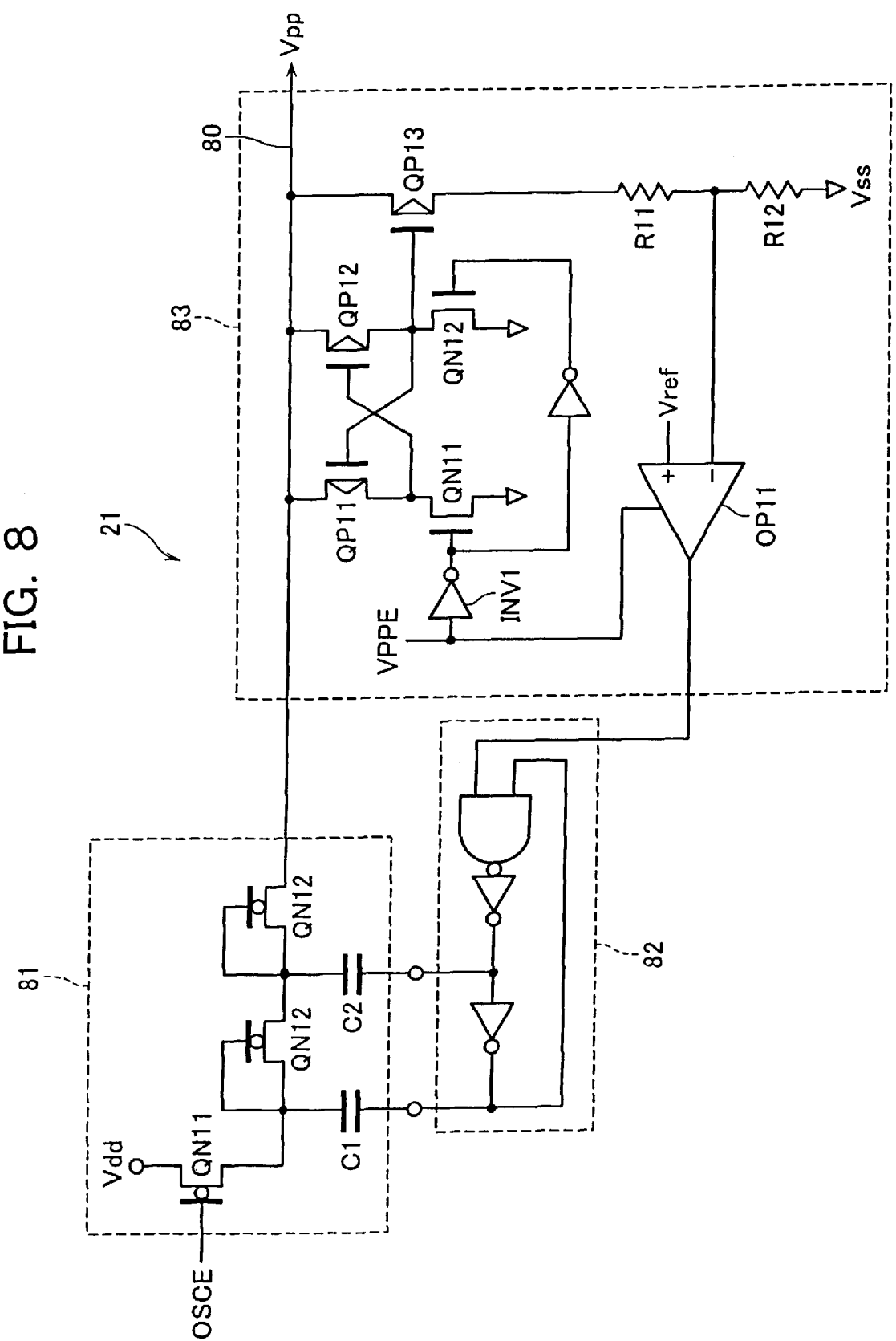
FIG. 8 is a diagram showing a practically reduced configuration of the internal voltage generation circuit of the same EEPROM.

A practically implemented configuration of the internal voltage generator circuit 21 is shown in FIG. 8. As shown herein, this is a booster circuit that is operable to boost the power supply voltage Vdd to generate a potentially raised or "boosted" voltage Vpp. The booster circuit 21 has its main or "core" part 81, which is a charge pump circuit made up from a serial combination of three N-channel metal oxide semiconductor (NMOS) transistors QN11 to QN13, each of which has a threshold voltage of almost zero volts, and capacitors C1–C2 associated therewith. The capacitors C1–2 have terminals which are complementarily driven by a ring oscillator 82 as coupled thereto. The charge pump circuit 81 has its boosted voltage output node 80, which is connected to a voltage limiter circuit 83. This circuit 83 is for detection of the exact potential level of a boosted output voltage Vpp being derived from node 80 on a real time basis to thereby perform turn-on/off control of ring oscillator 82.

The voltage limiter circuit 83 is configured to have, between the boosted output node 80 and ground terminal Vss, a serial combination of a switching P-channel MOS (PMOS) transistor QP13 and resisters R11, R12 for level detection. Voltage limiter 83 also has an operation amplifier or "opamp" OP11, which is the one that determines or "judges" a potential level at a connection node of resistors R11–R12 to thereby perform turn-on/off control of the ring oscillator 82. Circuit part consisting of the PMOS transistors QP11–QP12 and NMOS transistors QN11–12 makes up a switch control circuit which performs turn-on/off control of switching PMOS transistor QP13 under control of the boost enable signal VPPE stated previously.

An operation of this voltage limiter 83 is as follows. When the boost enable signal VPPE is at "L" level, the NMOS transistor QN11 turns on whereas NMOS transistor QN12 turns off. The PMOS transistor QP12 turns on. At this time the switching PMOS transistor QP13 is kept off with its gate connected to the boosted voltage output node 80. When the boost enable signal VPPE goes high at "H" level, NMOS transistor QN11 turns off, NMOS transistor QN12 turns on, and PMOS transistor QP12 turns off. Whereby, switching PMOS transistor QP13 is grounded at its gate, making voltage limiter 83 active.

While the boosted voltage Vpp of the boosted voltage output node 80 stays low in potential level, an output of the opamp OP11 is at "H" level. This causes the oscillator 82 to perform an oscillation operation, thereby rendering the charge pump circuit 81 operative. When the boosted output voltage Vpp reaches a prespecified level, the output of opamp OP11 is set at "L" level, causing oscillator 82 to turn off. The voltage boost operation is thus terminated. With the voltage boost operation control stated above, a constant output voltage Vpp is obtainable at the boosted voltage output node 80 in any events.

Figure 9:
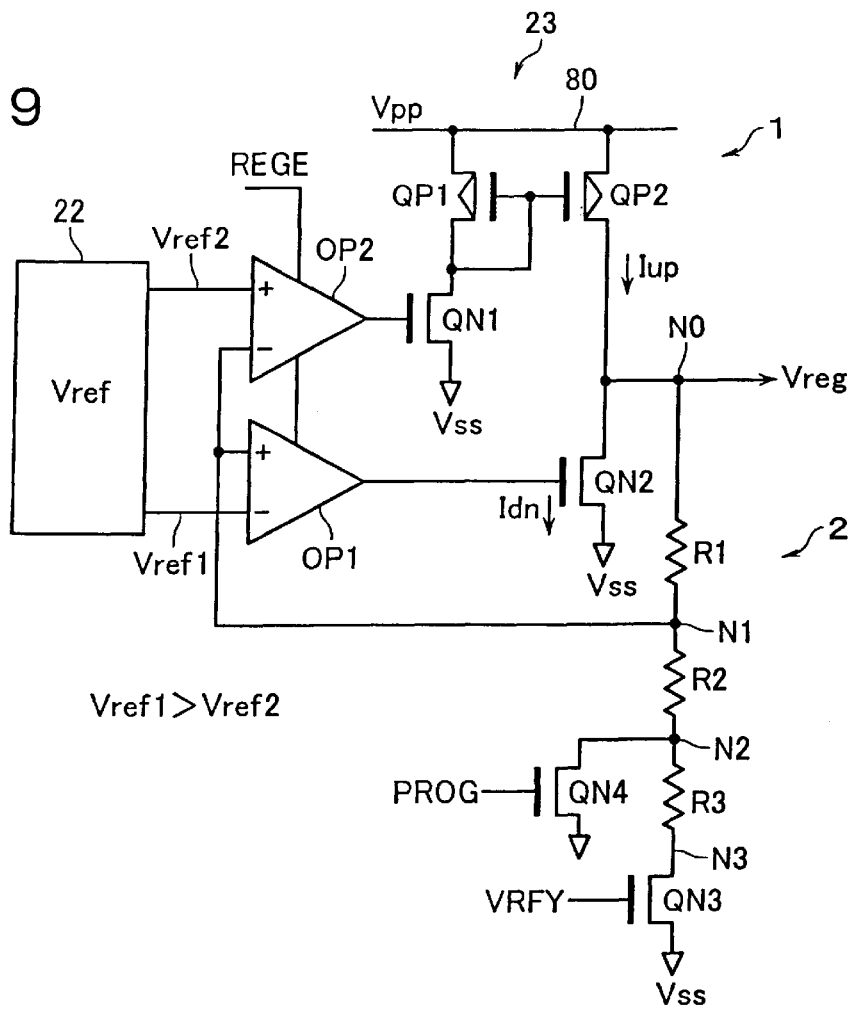
FIG. 9 is a diagram showing a practical arrangement of the regulator of the EEPROM.

See next FIG. 9. This diagram shows a circuit configuration of the voltage regulator 23 as used in this embodiment. As in the prior art regulator shown in FIG. 18, the regulator circuit shown herein is principally configured from a driver circuit 1 and a resistor-based potential dividing circuit 2 operatively associated with a couple of operational amplifiers OP1, OP2. The driver 1 has a PMOS transistor QP2 for pull-up drive and an NMOS transistor QN2 for pull-down drive. The resistive voltage divider circuit 2 is operable to receive an output control voltage of driver 1 and then potentially divide this voltage at an appropriate potential division ratio. The opamps OP1–OP2 are for control of driver 1 through feedback of an output of voltage divider 2.

The PMOS transistor QP2 and NMOS transistor QN2 have drains common-coupled together at a circuit node N0, which is for use as an output terminal of the regulated voltage Vreg stated supra. PMOS transistor QP2 has a source connected to the boosted voltage output node 80. NMOS transistor QN2 has its source coupled to the ground terminal Vss.

The opamp OP1 is responsible for control of the current drivability of NMOS transistor QN2. The opamp OP2 is for control of the current drivability of PMOS transistor QP2. One of these opamps, i.e. opamp OP1, derives an output voltage, which is used to directly control the gate of pull-down NMOS transistor QN2. The remaining opamp OP2 produces its output as used to control the gate of a source-grounded NMOS transistor QN1. A PMOS transistor QP1 is such that its gate and drain are connected to the drain of NMOS transistor QN1 with its source coupled to the boosted voltage output node 80. The PMOS transistor QP1 is for use as a current source load. This PMOS transistor QP1 and the pull-up PMOS transistor QP2 are such that their gates are common-coupled together, thus making up a current mirror circuit. With such an arrangement, controlling the current drivability of NMOS transistor QN1 enables control of a current of the pull-down PMOS transistor QP2.

Provided between the driver 1's output node N0 and the ground terminal Vss is a serial combination of resistors R1 to R3 and a switching NMOS transistor QN3 for constitution of the voltage divider circuit 2. Resistors R2–R3 have a common connection node N1, to which an NMOS transistor QN4 is coupled. This transistor QN4 is for ground connection of a node N2 under control of the write control signal PROG. NMOS transistor QN4 has its gate which is controlled by the verify-read control signal VRFY, causing a connection node N3 of resistor R3 and NMOS transistor QN3 to be grounded selectively.

Figure 18:
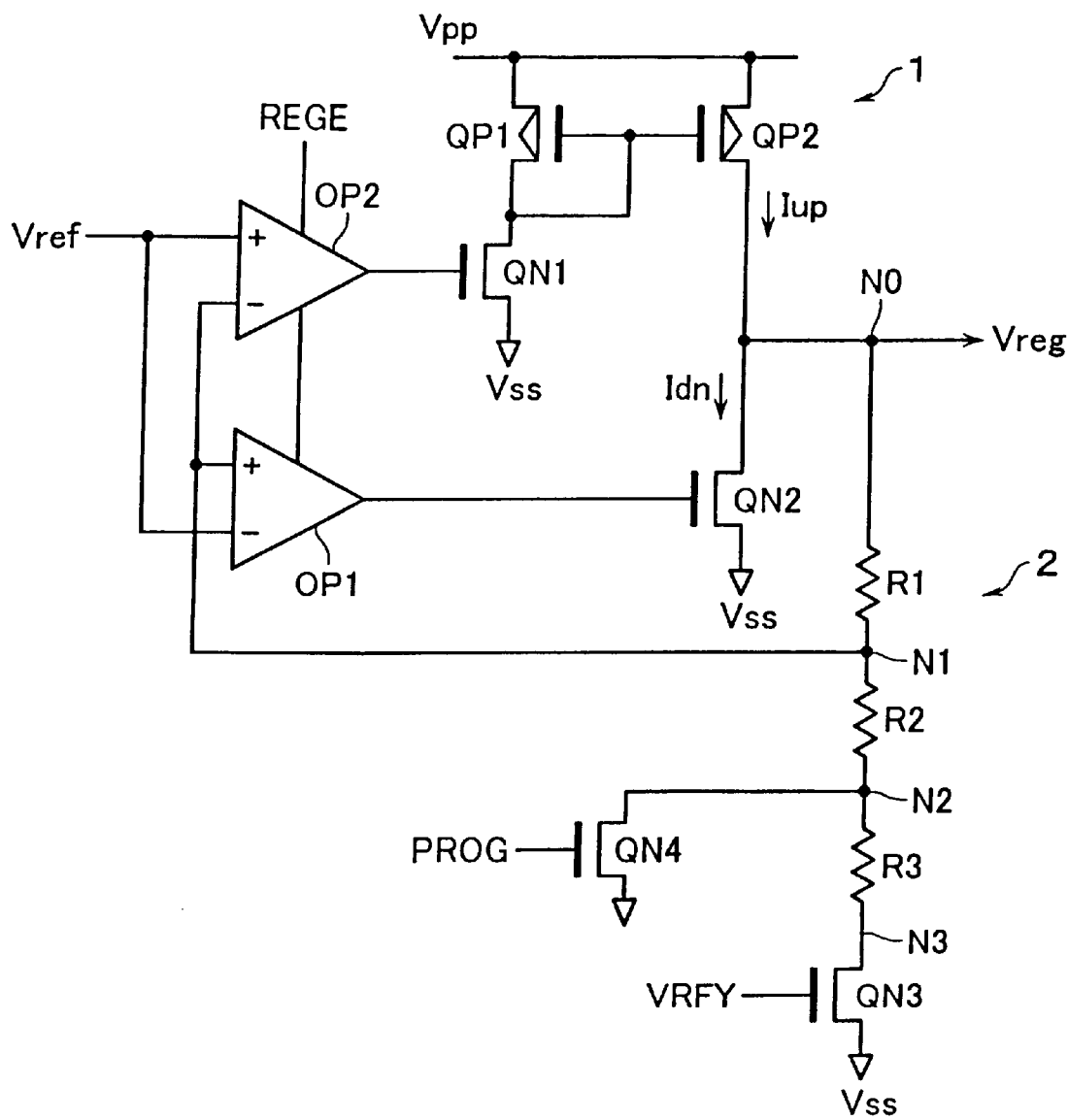
FIG. 18 is a diagram showing a configuration of one typical prior known regulator.

A difference of the voltage regulator 23 of the illustrative embodiment from the arrangement shown in FIG. 18 is that the opamps OP1 and OP2 are different in reference voltage from each other. More specifically, a reference voltage Vref1 being input to an inverting (−) input terminal of one opamp OP1 is different in potential from a reference voltage Vref2 as input to a non-inverting (+) input terminal of the other opamp OP2 in a manner such that Vref1 is set at a carefully chosen value which is slightly higher than Vref2. Regulator 23 is similar to that of FIG. 18 in that a potentially divided output voltage obtainable at the connection node N1 of resistors R1–R2 in voltage divider circuit 2 is fed back to the non-inverting input terminal of opamp OP1 and the inverting input terminal of opamp OP2, respectively.

Figure 12:
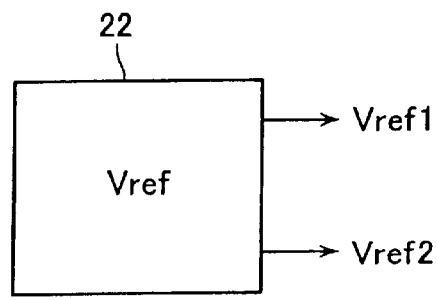
FIG. 12 is a diagram showing a configuration of a reference voltage generation circuit of FIG. 9.

Another feature unique to the regulator 23 of FIG. 9 is that the required two reference voltages Vref1, Vref2 are generated by a single reference voltage generator circuit 22 having its integrated core circuitry with two separate reference voltage output nodes as shown in FIG. 12, rather than by mere use of separate or "discrete" reference voltage generator circuits. This point will be set forth later in greater detail.

Figure 10:
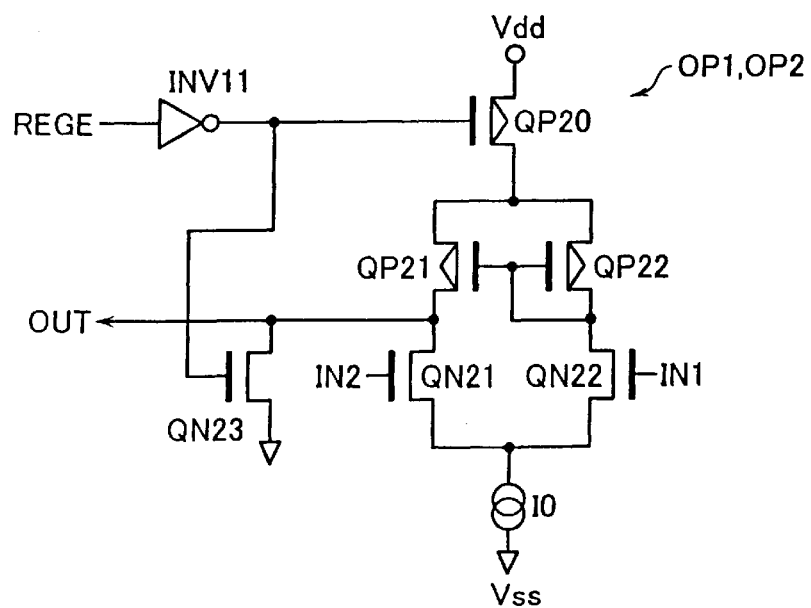
FIG. 10 is a diagram showing a configuration of an operational amplifier as used in the regulator of FIG. 9.

A practically reduced configuration of a respective one of the opamps OP1–OP2 is shown in FIG. 10. As shown herein, each opamp OP1, OP2 may be a differential amplifier of the complementary MOS (CMOS) current mirror type. This CMOS current-mirror differential amplifier includes a current mirror load made up from a pair of PMOS transistors QP21, QP22 and a driver unit formed of another pair of NMOS transistors QN21–QN22. These driver transistors QN21–22 have common-coupled sources which are grounded via a current source I0. PMOS transistors QP21–22 have common sources which are connected to a power supply terminal through an activation-use PMOS transistor QP20. This PMOS transistor QP20 has its gate, to which the above-noted regulator enable signal REGE enters through an inverter INV11. This inverter INV11 derives its output, which will also be supplied to a gate of NMOS transistor QN23 as provided to reset an output terminal.

Figure 11:
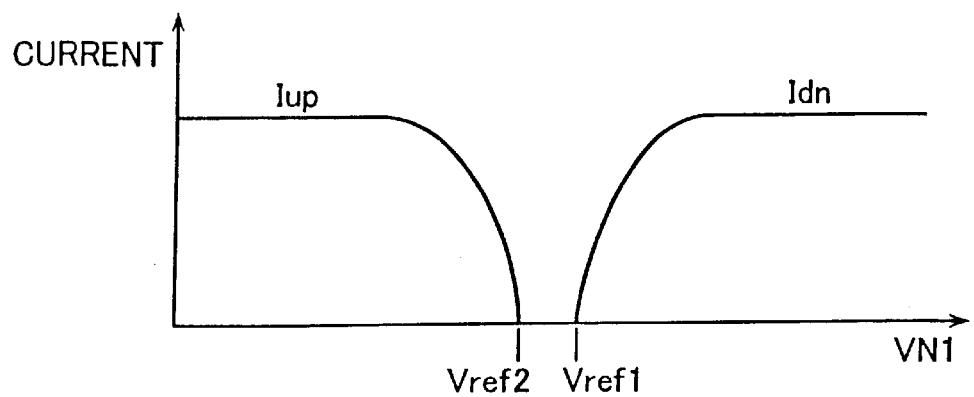
FIG. 11 is a graph showing a current-versus-voltage characteristic of the regulator of FIG. 9.
Figure 19A:
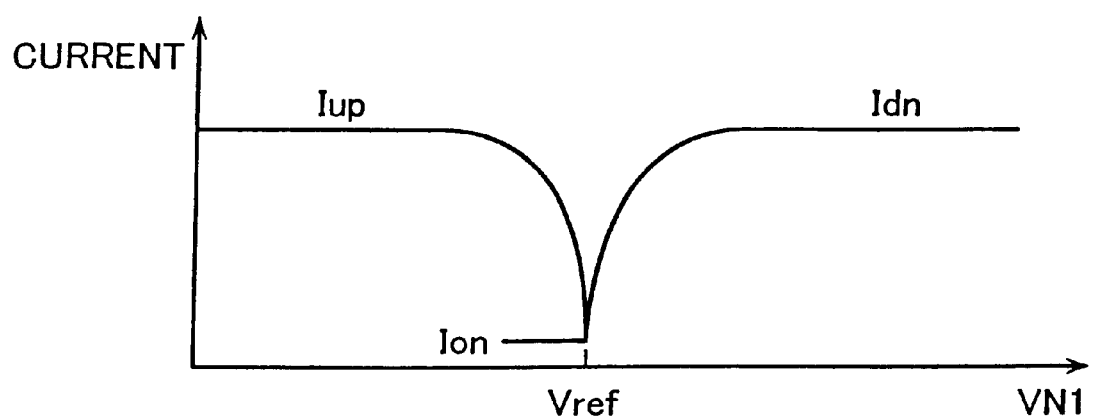
FIGS. 19A–19B are graphs each showing a current-voltage characteristic of the prior art regulator.

The voltage regulator 23 of this embodiment is controllable by the two different reference voltages Vref1, Vref2 discussed previously. Appropriate setting of these two reference voltages Vref1–2 permits a pull-up current Iup flowing in the pull-up PMOS transistor QP2 of regulator 23 and a pull-down current Idn flowing in the pull-down NMOS transistor QN2 thereof to exhibit specific characteristics as shown in FIG. 11. Unlike the current-voltage characteristics of FIGS. 19A–19B, the pull-up current Iup behaves to become zero at a point at which a potentially divided output voltage VN1 at the node N1 of voltage divider circuit 2 becomes equal to the reference voltage Vref2 whereas the pull-down current Idn becomes zero at a point whereat the divided output voltage VN1 is equal to the reference voltage Vref1, which is higher in potential than reference voltage Vref2.

A concrete explanation will be given of an operation of the regulator 23 in accordance with the timing of FIG. 7. At a time point t0, the boost enable signal VPPE and regulator enable signal REGE potentially go high at "H" level. This potential increment permits a voltage boost operation and regulator operation to get started. Assume that at this time, the write control signal PROG is also set at "H" simultaneously. This causes the NMOS transistor QN4 to turn on, resulting in the node N2 being grounded in the voltage divider circuit 2. At this time the potential division ratio of voltage divider 2 is given as R2/(R1+R2).

While the regulated voltage Vreg stays lower in potential, the opamp OP2 derives its output of high level, whereby the NMOS transistor QN1 is driven to turn on so that the pull-up current Iup rushes to flow owing to the PMOS transistor QP2. The other opamp OP1 provides its output which stays at low level, causing NMOS transistor QN2 to be kept nonconductive, i.e. off. Thus the regulated voltage Vreg potentially increases with an increase in potential of the boosted output voltage Vpp.

Upon potential increase of the regulated voltage Vref up to a predetermined level as represented by Vreg=Vref2·(R1+R2)/R2, the output of opamp OP2 drops down at low level. This causes NMOS transistor QN1 to turn off, thereby letting PMOS transistor QP2 turn off, resulting in the pull-up current Iup becoming zero. Thus the regulated voltage Vreg stops its potential rise-up. The exact value of control voltage Vreg is determinable by the Vref2, R1, R2 values from the above Equation. For instance, a potentially stabilized write-use voltage of Vreg=9V is obtained as shown in FIG. 7. During this session, the output of opamp OP1 stays at low level; thus, any appreciable pull-down current Idn does not flow.

At instant t1 of FIG. 7, when the write control signal PROG drops down in potential to reach "L" level while the verify-read control signal VRFY goes high at "H" level, the node N3 of voltage divider circuit 2 is grounded causing the potential division ratio of voltage divider 2 change to measure (R2+R3)/(R1+R2+R3). This forces the potentially divided output voltage being fed back to opamps OP1–2 to increase in potential, which in turn permits the output of opamp OP1 to change or "transit" to the high level side, thereby driving NMOS transistor QN2 to turn on. This results in flow of pull-down current Idn, causing the regulated voltage Vreg at output terminal N0 to drop down accordingly.

When the regulated voltage Vreg decreases at a level defined as Vref=Vref1·(R1+R2+R3)/(R2+R3), the output of opamp OP1 is set at low level. This forces NMOS transistor QN2 to turn off causing the pull-down current Idn to become zero; thus, the regulated voltage Vreg's level reduction stops. The value of such regulated voltage Vreg at this time is determinable by the Vref1, R1–R3 values. One example is that a potentially stabilized verify-read voltage of Vref=7V is obtained as shown in FIG. 7.

Figure 19B:
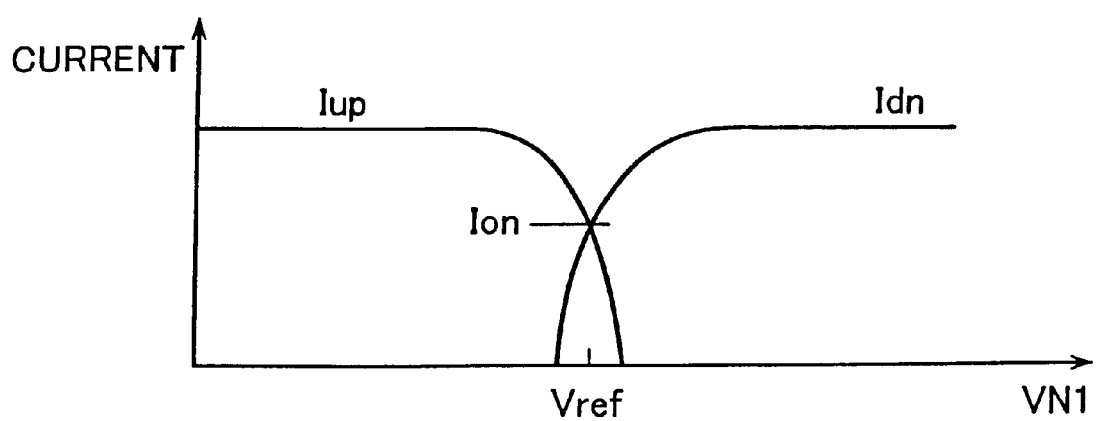

In the way stated above, with the voltage regulator 23 of this embodiment, the use of two different reference voltages Vref1, Vref2 precludes both the pull-up PMOS transistor QP2 and the pull-down NMOS transistor QN2 from attempting to turn on at a time. Consequently, even in cases where slight input offset voltage(s) is/are present at the opamps OP1–OP2, it becomes possible to prevent without failure the occurrence of any unwanted flow of large penetration currents as shown in FIG. 19B, while still retaining the possibility of establishment of the "ideal" state shown in FIG. 19A. To be brief, it is possible to virtually perfectly eliminate any possible penetration currents at driver 2, which in turn makes it possible to shorten a time as taken for the boosted output voltage Vpp to fully rise up at the required potential level—say, potential riseup or boost time period. It is thus possible to lessen or minimize a write time period of the Flash EEPROM device embodying the invention. Such write time reduction leads to a decrease in electrical power consumption thereof.

Preferably in this embodiment an undefined output range in which both the pull-up PMOS transistor QP2 and the pull-down NMOS transistor QN2 are turned off simultaneously is made smaller or minimized for the purpose of circuit operation stabilization. To this end, the two reference voltages Vref1, Vref2 are specifically designed to have a small difference of about 10 millivolts (mV), by way of example.

Accordingly with this embodiment, the two reference voltages Vref1, Vref2 are such that the stability of a potential difference is more important thereto than the stability of the absolute values thereof. From this point of view, as shown in FIG. 12, the single reference voltage generator circuit 22 is specifically employed to generate these two reference voltages Vref1–Vref2. With the "single-circuit/two-voltage creation" feature, even where the reference voltage generator circuit 22 suffers from certain variation or deviation occurring due to manufacturing processes or the like, it is possible to allow the two reference voltages Vref1–2 to potentially increase or decrease together. This in turn makes it possible to force a difference between Vref1 and Vref2 to stay at a prefixed level in any events.

Figure 14:
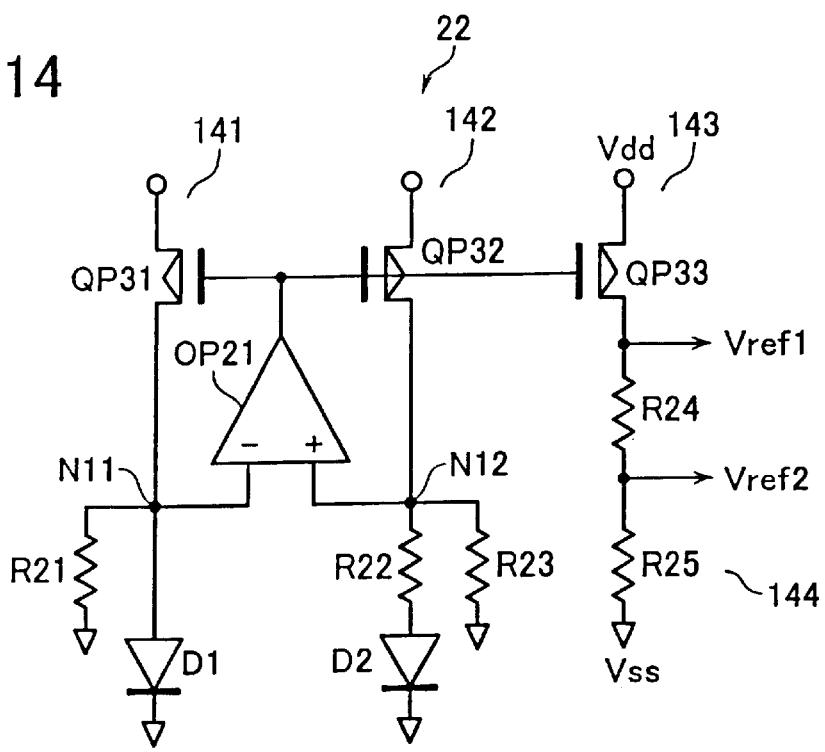
FIG. 14 is a diagram showing an exemplary configuration of the reference voltage generation circuit of FIG. 12.
Figure 15:
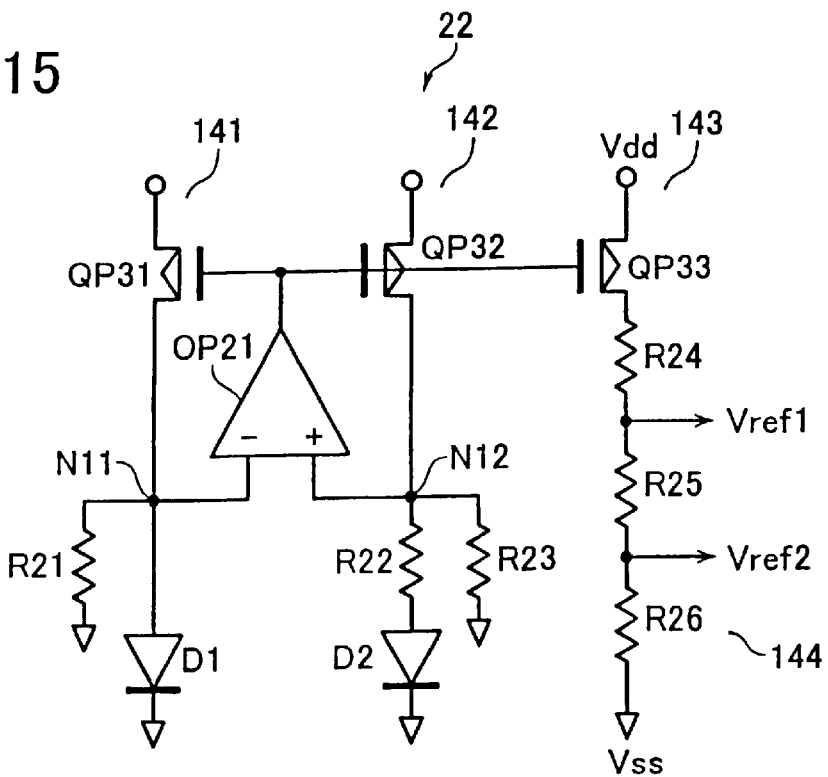
FIG. 15 is a diagram showing another configuration example of the reference voltage generation circuit of FIG. 12.

Typical examples of the reference voltage generator circuit 22 are band-gap reference (BGR) circuits as shown in FIGS. 14 and 15. Each BGR circuit shown herein includes three current flow paths 141, 142, 143. The first current flow path 14 has a serial connection of a PMOS transistor QP31 for use as a current source and a diode D1 along with a resistor R21 as connected in parallel to the diode D1. The second current flow path 142 has a serial combination of a current-source PMOS transistor QP32 and a resistor R22 plus a diode D2 and also has a resistor R23 as parallel-connected to the resistor R22 and diode D2. The diodes D1 and D2 are designed to have a predetermined area ratio.

The current-source PMOS transistors QP31–QP32 have gates which are common-coupled together. An operational amplifier OP21 is provided, which has its output terminal connected to gates of these current-source PMOS transistors QP31–32 and two input terminals that are connected to nodes N11, N12 of the first and second current flow paths 141–142 respectively. Making the current-source PMOS transistors QP31–32 equal in size to each other permits the same current to flow in the first current flow path 141 and second current flow path 142. The opamp OP21 controls the degree of electrical conduction of current-source PMOS transistors QP31–32 in such a way that the node N11 of the first current flow path 141 and the node N12 of second current flow path 142 are constantly held at the same potential.

The third current flow path 143 is an output circuit which is formed of a current-source PMOS transistor QP33 that makes up a current mirror circuit together with the PMOS transistors QP31–32 and a resistor for use as a load. In FIG. 14 the load resistor constitutes a voltage divider circuit 144 with a serial combination of resistors R24, R25. The resistor R24 is coupled to the PMOS transistor QP33 at a connection node, which acts as an output node of the first reference voltage Vref1. A connection node of resistors R24 and R25 is an output node of the second reference voltage Vref2.

The circuitry of FIG. 15 is similar to that of FIG. 14 with its output circuit configuration being slightly modified. More specifically, the load resistor makes up the voltage divider circuit 144 with a serial combination of resistors R24–R26. A connection node of two resistors R24–25 serves as the output node of first reference voltage Vref1 whereas a node of resistors R25–26 is the output node of second reference voltage Vref2.

In the reference voltage generator circuit 22 of FIG. 14, the first reference voltage Vref1 without any appreciable temperature dependabilities is generated by optimal setup of the area ratio of the diodes D1–D2 and the values of resistors R21, R22, R23 and (R24+R25). This reference voltage Vref1 is then subjected to potential division to thereby generate the second reference voltage Vref2. Similarly with the reference voltage generator circuit 22 of FIG. 15, the first reference voltage Vref1 with no temperature dependabilities is produced by optimally setting the area ratio of diodes D1–2 and the values of resistors R21, R22, R23 and (R24+R25+R26). This reference voltage Vref1 is potentially divided to thereby generate the second reference voltage Vref2.

In this way, the two reference voltages Vref1, Vref2 are generated by a single BGR circuit and its associative voltage divider circuit for potential division of an output of the former. With such an arrangement, the two reference voltages Vref1–2 are expected to vary together in the same direction in spite of any possible fabrication process variation, thus enabling a difference therebetween to stay substantially at a fixed level constantly.

Figure 13:
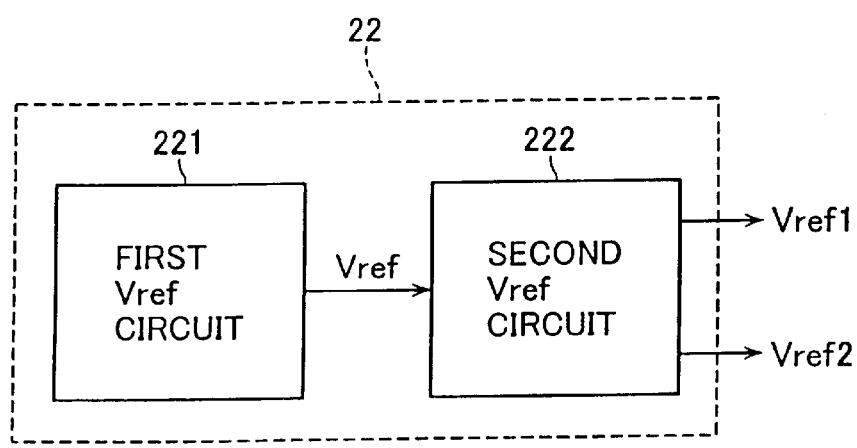
FIG. 13 is a diagram showing another available configuration of the reference voltage generation circuit of FIG. 9.

In view of the fact that the two reference voltages Vref1–2 may be designed to be varied together in accordance with a variation or deviation in circuit characteristics in the way stated above, the reference voltage generator circuit 22 may alternatively be modified in configuration as shown in FIG. 13. This reference voltage generator circuit 22 is made up from a couple of circuit modules: a first or "pre stage" reference voltage generator circuit 221 and a second or "post stage" reference voltage generator circuit 222. The pre-stage voltage generator 221 is for generation of an original or "root" reference voltage Vref. The post-stage reference voltage generator 222 is responsive to receipt of an output of the pre-stage circuit for potentially dividing it to thereby generate the two reference voltages Vref1, Vref2 required.

The pre-stage reference voltage generator circuit 221 may be a BGR circuit. As shown in FIGS. 16A to 16D, the post-stage reference voltage generator circuit 222 is configurable from a voltage follower 161 employing an operational amplifier OP31 for receipt of the reference voltage Vref as output from the prestage reference voltage generator 221 and a resistive voltage divider circuit 162 that is provided at the output of the voltage follower 161. With such an arrangement, a potential difference between two reference voltages Vref1, Vref2 is stably held or stabilized constantly even in cases where the original reference voltage Vref per se varies little in potential.

Figure 16A:
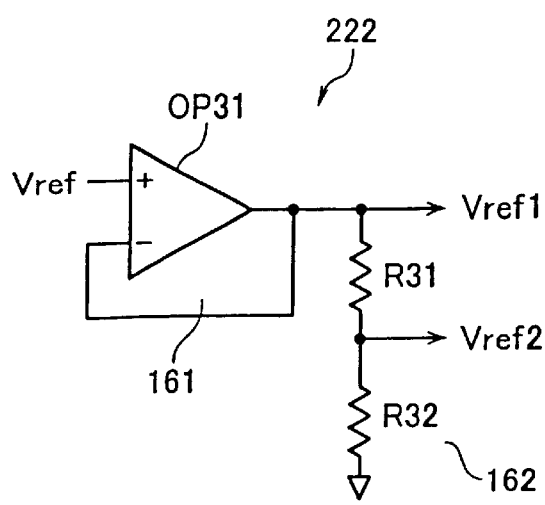
FIGS. 16A to 16D are diagrams each showing a configuration example of a second reference voltage generator unit of FIG. 13.
Figure 16B:
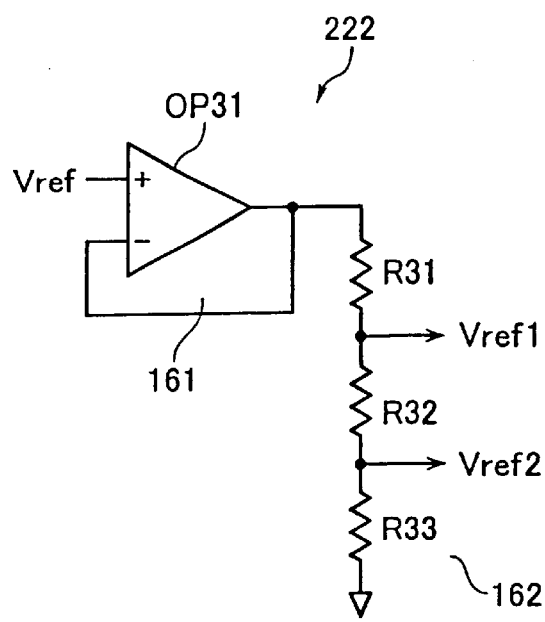

In the circuits of FIGS. 16A–16B, the voltage follower 161 is formed of an operational amplifier OP131 having an inverting input terminal, a non-inverting input terminal for use as an input terminal of the reference voltage Vref, and an output terminal being fed back to the inverting input. In FIG. 16A an output of voltage follower 161 is used as the reference voltage Vref1 whereas a connection node of resistors R31–32 to which this voltage is supplied for use as a terminal from which the reference voltage Vref2 is obtained. Obviously the first reference voltage Vref1 has its potential value that is equal to that of the original reference voltage Vref whereas the second reference voltage Vref2 is slightly lower in value than it. In the circuitry of FIG. 16B, its voltage divider circuit 162 is formed of a serial combination of three resistors R31–R33 for generating two reference voltages Vref1, Vref2 lower in potential than the reference voltage Vref.

Figure 16C:
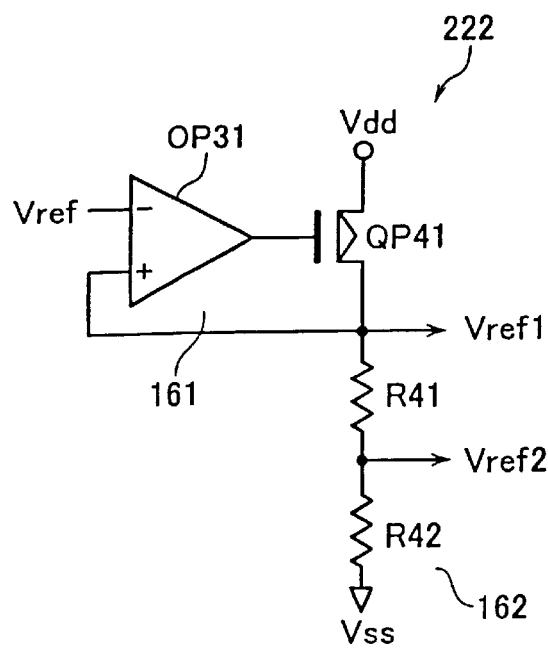
Figure 16D:
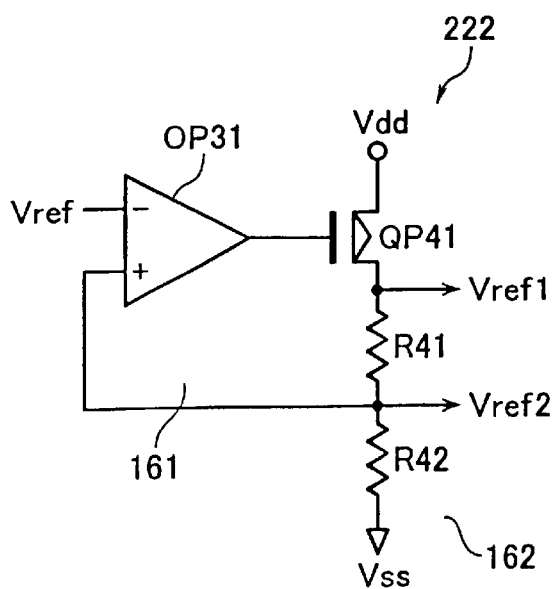

In the circuits of FIGS. 16C–16D, the voltage follower 161 is arranged including, in addition to the operational amplifier OP31, a current-source PMOS transistor QP41 having its gate as controlled by an output of opamp OP31. In this case the reference voltage Vref is input to the inverting input terminal of opamp OP31. In the circuitry of FIG. 16C the current-source PMOS transistor QP41's drain serves as an output terminal of the first reference voltage Vref1, which is fed back to the non-inverting input of opamp OP31 while being connected to the resistive voltage divider circuit 162. Accordingly the first reference voltage Vref1 is made equal in potential to the original reference voltage Vref whereas the second reference voltage Vref2 is slightly lower than it. In the circuitry of FIG. 16D the current-source PMOS transistor QP41's drain is for use as the output terminal of the reference voltage Vref1, with the connection node of resistors R41–R42 being coupled and fed back to the non-inverting input of opamp OP31. Thus the second reference voltage Vref2 is equal to the original reference voltage Vref whereas the first reference voltage Vref1 is little higher than it.

Figure 17:
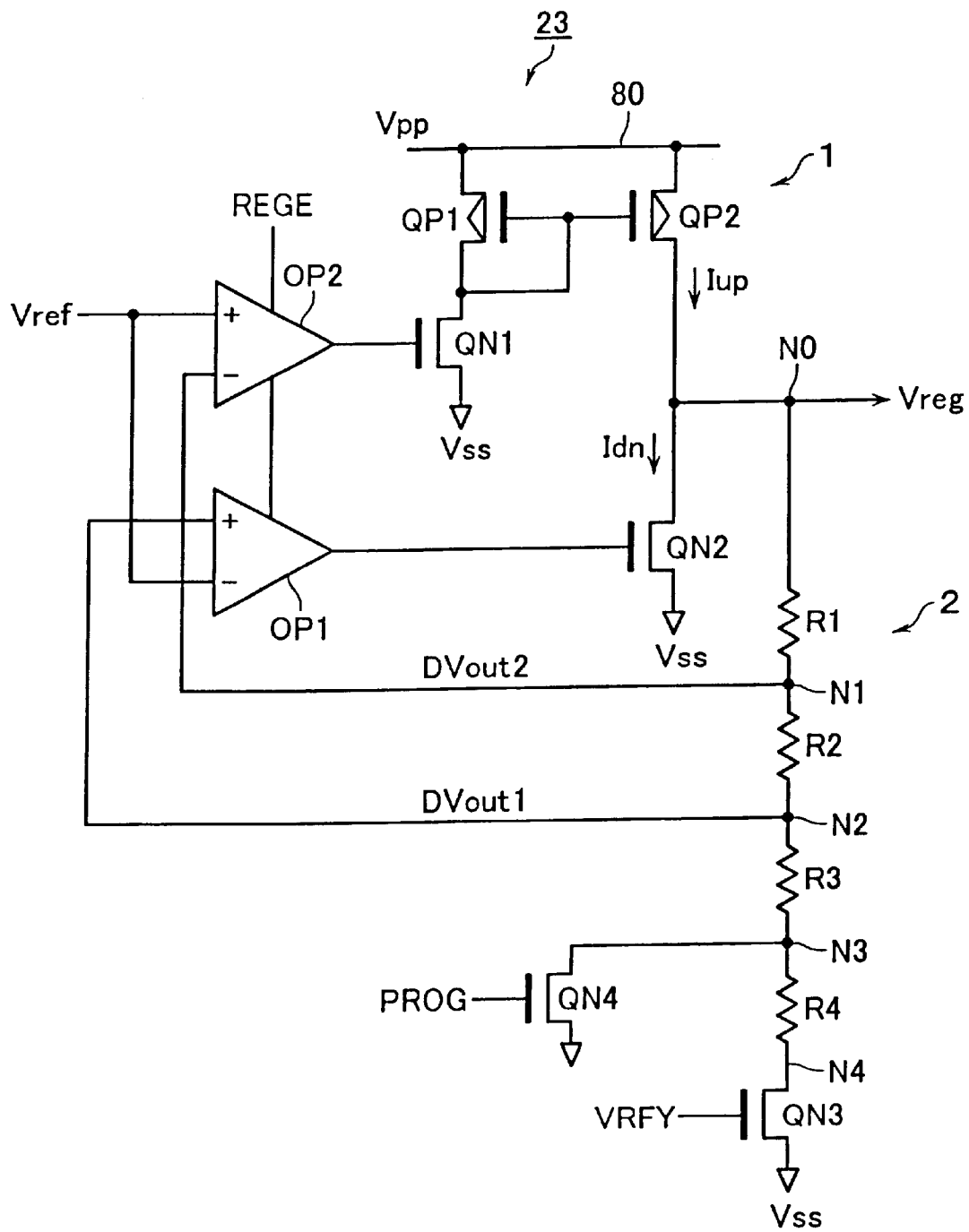
FIG. 17 is a diagram showing a configuration of a voltage regulator in accordance with another embodiment of the invention.

Turning to FIG. 17, there is depicted a configuration of a voltage regulator 23 in accordance with another embodiment of this invention. Parts or components corresponding to those of the FIG. 9 embodiment are designated by the same reference characters, and any detailed explanations thereof will be eliminated herein for brevity purposes. The FIG. 17 circuitry is similar to that of FIG. 9 with the two operational amplifiers OP1, OP2 being modified to receive the same or "common" reference voltage Vref while alternatively letting them be different from each other in feedback voltage.

More specifically, a voltage divider circuit 2 of FIG. 17 is formed of a serial combination of four resistors R1 to R4. A first potentially divided output voltage DVout1 as obtainable at a connection node N2 of serial-coupled resistors R2, R3 is fed back to the non-inverting input of the opamp OP1 that is used for control of a pull-down current Idn. In addition, let a second divided output voltage DVout2 obtainable at a connection node N1 of serial resistors R1–R2 be fed back to the inverting input of the opamp OP2 used for control of a pull-up current Iup.

With such an arrangement, the potentially divided output voltage DVout1 for feedback to the opamp OP1 is lower in potential than the divided output voltage DVout2 for feedback to opamp OP2. This in turn guarantees achievement of substantially equivalent operability to the previous embodiment with its two opamps OP1, OP2 being given mutually different reference voltages Vref1, Vref2 and with the same potentially divided output voltage fed back thereto. Consequently as in the previous embodiment, it becomes possible for the FIG. 17 embodiment to perform the regulated voltage control operation with any penetration current at driver 1 being greatly suppressed to virtually zero even where the opamps OP1–2 exhibit some input offsets.

It has been stated that the voltage regulator incorporating the principles of this invention is specifically arranged to give slightly different reference voltages to two operational amplifiers for performing current drivability control of pull-up and pull-down transistors, or alternatively permit feedback thereto of potentially divided output voltages with a slight difference therebetween. Thus it is possible to successfully minimize or virtually perfectly eliminate any possible penetration currents flowing in the voltage regulator.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:
1. A semiconductor device with a voltage regulator for outputting a regulated voltage potentially varying in response to an output voltage of an internal voltage generation circuit, wherein said voltage regulator comprises:
   a driver including a pull-up transistor and a pull-down transistor serially connected between an output node of said internal voltage generation circuit and a reference potential terminal, for outputting a regulated voltage at its regulated voltage output node corresponding to the connection node of said pull-up and pull-down transistors;
   a voltage divider circuit configured to potentially subdivide said regulated voltage output at said regulated voltage output node;
   a first operational amplifier configured to control current drivability of said pull-down transistor in accordance with a difference between a first reference voltage and a divided output voltage of said voltage divider circuit; and
   a second operational amplifier configured to control current drivability of said pull-up transistor in accordance with a difference between a second reference voltage and said divided output voltage of said voltage divider circuit in such a way as to vary in a reverse direction to the current drivability of said pull-down transistor.

2. The semiconductor device according to claim 1, wherein said driver comprises:
   a first p-channel transistor for use as said pull-up transistor having a source connected to the output node of said internal voltage generation circuit and a drain coupled to said regulated voltage output node;
   a first n-channel transistor for use as said pull-down transistor having a source connected to said reference potential terminal and a drain connected to said regulated voltage output node plus a gate under control of an output of said first operational amplifier;
   a second n-channel transistor having a source connected to said reference potential terminal and a gate under control of an output of said second operational amplifier; and
   a second p-channel transistor having a source connected to the output node of said internal voltage generation circuit and its gate and drain coupled to the drain of said second n-channel transistor and the gate of said first p-channel transistor, said second p-channel transistor making up a current mirror together with said first p-channel transistor.

3. The semiconductor device according to claim 1, wherein said first reference voltage is set higher in potential than said second reference voltage, and wherein said first operational amplifier has an inverting input terminal for receipt of said first reference voltage and a non-inverting input terminal for receipt of the output of said voltage divider circuit whereas said second operational amplifier has a non-inverting input terminal for receipt of said second reference voltage and an inverting input terminal for receipt of the output of said voltage divider circuit.

4. The semiconductor device according to claim 1, wherein said internal voltage generation circuit is a potential boosting circuit configured to potentially increase a power supply voltage.

5. The semiconductor device according to claim 1, further comprising:
   a single reference voltage generation circuit having a first output node for output of said first reference voltage and a second output node for output of said second reference voltage.

6. The semiconductor device according to claim 5, wherein said reference voltage generation circuit is a band gap reference circuit for output of said first reference voltage and has its output circuit unit with voltage divider circuit arranged therein for potentially dividing said first reference voltage to thereby output said second reference voltage.

7. The semiconductor device according to claim 5, wherein said reference voltage generation circuit includes a first reference voltage generator unit for output of a third reference voltage, and a second reference voltage generator unit for generation of said first and second reference voltages based on said third reference voltage as output from said first reference voltage generator unit.

8. The semiconductor device according to claim 7, wherein said second reference voltage generator unit comprises:
 a voltage follower with said third reference voltage being input thereto; and
 a voltage divider circuit configured to generate said first and second reference voltages through potential subdivision of an output voltage of said voltage follower.

9. The semiconductor device according to claim 1, further comprising:
 a memory cell array with electrically rewritable and erasable nonvolatile memory cells laid out therein;
 a low-decoder/word-line driver for selection of a word line of the memory cell array to drive the word line by use of a control voltage as output from said voltage regulator;
 a sense amplifier circuit for sensing data as read out of said memory cell array; and
 a data latch circuit for holding therein data to be written into said memory cell array.

10. A semiconductor device with a voltage regulator for outputting a regulated voltage potentially varying in response to an output voltage of an internal voltage generation circuit, wherein said voltage regulator comprises:
 a driver including a pull-up transistor and a pull-down transistor serially connected between an output node of said internal voltage generation circuit and a reference potential terminal, for outputting a regulated voltage at its regulated voltage output node corresponding to the connection node of the pull-up and pull-down transistors;
 a voltage divider circuit configured to potentially subdivide said regulated voltage output at said regulated voltage output node to thereby obtain a first divided output voltage and a second divided output voltage;
 a first operational amplifier configured to control a current drivability of said pull-down transistor in accordance with a difference between a reference voltage and the first divided output voltage of said voltage divider circuit; and
 a second operational amplifier configured to control a current drivability of said pull-up transistor in accordance with a difference between the reference voltage and the second divided output voltage in a way such that said pull-down transistor increases in current drivability with a decrease in current drivability of said pull-down transistor and vice versa.

11. The semiconductor device according to claim 10, wherein said driver comprises:
 a first p-channel transistor for use as said pull-up transistor having a source connected to the output node of said internal voltage generation circuit and a drain coupled to said regulated voltage output node;
 a first n-channel transistor for use as said pull-down transistor having a source connected to said reference potential terminal and a drain connected to said regulated voltage output node plus a gate under control of an output of said first operational amplifier;
 a second n-channel transistor having a source connected to said reference potential terminal and a gate under control of an output of said second operational amplifier; and
 a second p-channel transistor having a source connected to the output node of said internal voltage generation circuit and its gate and drain coupled to the drain of said second n-channel transistor and the gate of said first p-channel transistor, said second p-channel transistor making up a current mirror together with said first p-channel transistor.

12. The semiconductor device according to claim 10, wherein said first divided output voltage is set lower than said second divided output voltage, and wherein said first operational amplifier has an inverting input terminal for receipt of said reference voltage and a non-inverting input terminal for receipt of said first divided output voltage of said voltage divider circuit whereas said second operational amplifier has a non-inverting input terminal for receipt of said reference voltage and an inverting input terminal for receipt of said second divided output voltage of said voltage divider circuit.

13. The semiconductor device according to claim 10, wherein said internal voltage generation circuit is a potential boosting circuit configured to potentially increase a power supply voltage.

14. The semiconductor device according to claim 10, further comprising:
 a single reference voltage generation circuit having a first output node for output of said first reference voltage and a second output node for output of said second reference voltage.

15. The semiconductor device according to claim 14, wherein said reference voltage generation circuit is a band gap reference circuit for output of said first reference voltage and has its output circuit unit with voltage divider circuit arranged therein for potentially dividing said first reference voltage to thereby output said second reference voltage.

16. The semiconductor device according to claim 14, wherein said reference voltage generation circuit includes a first reference voltage generator unit for output of a third reference voltage, and a second reference voltage generator unit for generation of said first and second reference voltages based on said third reference voltage as output from said first reference voltage generator unit.

17. The semiconductor device according to claim 16, wherein said second reference voltage generator unit comprises:
 a voltage follower with said third reference voltage being input thereto; and
 a voltage divider circuit configured to generate said first and second reference voltages through potential subdivision of an output voltage of said voltage follower.

18. The semiconductor device according to claim 10, further comprising:
 a memory cell array with electrically rewritable and erasable nonvolatile memory cells laid out therein;
 a low-decoder/word-line driver for selection of a word line of this memory cell array to drive the word line by use of the regulated voltage as output from said voltage regulator;
 a sense amplifier circuit for sensing data as read out of said memory cell array; and
 a data latch circuit for holding therein data to be written into said memory cell array.

* * * * *